US012772587B2

(12) United States Patent
Shimazaki

(10) Patent No.: US 12,772,587 B2
(45) Date of Patent: Oct. 20, 2026

(54) MICROLENS ARRAY AND MANUFACTURING METHOD THEREOF

(71) Applicant: TOPPAN Inc., Tokyo (JP)

(72) Inventor: Tomohiro Shimazaki, Taito-ku (JP)

(73) Assignee: TOPPAN Inc., Tokyo (JP)

( * ) Notice: Subject to any disclaimer, the term of this patent is extended or adjusted under 35 U.S.C. 154(b) by 414 days.

(21) Appl. No.: 18/483,039

(22) Filed: Oct. 9, 2023

(65) Prior Publication Data

US 2024/0036237 A1 Feb. 1, 2024

Related U.S. Application Data

(63) Continuation of application No. PCT/JP2022/017740, filed on Apr. 13, 2022.

(30) Foreign Application Priority Data

Apr. 14, 2021 (JP) ................................ 2021-068397

(51) Int. Cl.

*H10F 39/00* (2025.01)
*G02B 3/00* (2006.01)
*H10H 29/14* (2025.01)

(52) U.S. Cl.

CPC ....... *H10F 39/8063* (2025.01); *G02B 3/0043* (2013.01); *H10F 39/8053* (2025.01); *H10H 29/142* (2025.01)

(58) Field of Classification Search

CPC ...... G02B 3/00; G02B 3/0037; G02B 3/0043; G02B 3/0056; H01L 25/0753;

(Continued)

(56) References Cited

U.S. PATENT DOCUMENTS

2006/0119950 A1* 6/2006 Boettiger ............. G02B 3/0018 359/626
2006/0176566 A1* 8/2006 Boettiger ........... G02B 27/1073 359/619

(Continued)

FOREIGN PATENT DOCUMENTS

JP 2009-109965 A 5/2009
JP 2013-021168 A 1/2013
JP 2014-154662 A 8/2014

OTHER PUBLICATIONS

International Search Report issued Jun. 28, 2022 in PCT/JP2022/017740 filed Apr. 13, 2022, 5 pages.

*Primary Examiner* — Britt Hanley
*Assistant Examiner* — Kevin Quinto
(74) *Attorney, Agent, or Firm* — Oblon, McClelland, Maier & Neustadt, L.L.P.

(57) ABSTRACT

A solid-state imaging element includes a semiconductor substrate having photoelectric conversion elements, a color filter layer formed on the semiconductor substrate and having types of color filters positioned corresponding to the photoelectric conversion elements, and a microlens array including microlenses positioned corresponding to the color filters. The microlens array includes a PDAF pixel microlens positioned in a PDAF pixel of a pixel array unit and imaging pixel microlenses positioned in imaging pixels of the pixel array unit. The PDAF pixel microlens includes a lens part and a pedestal part adjoining the lens part and has a greater height than the imaging pixel microlenses.

20 Claims, 12 Drawing Sheets

(58) Field of Classification Search
CPC .... H10F 39/024; H10F 39/12; H10F 39/8053; H10F 39/8063; H10H 20/0363; H10H 20/855; H10H 29/142
See application file for complete search history.

(56) References Cited

U.S. PATENT DOCUMENTS

| | | | | |
|---|---|---|---|---|
| 2014/0218572 | A1 | 8/2014 | Ootsuka | |
| 2020/0154058 | A1 * | 5/2020 | Wu | H04N 25/778 |

* cited by examiner

MICROLENS ARRAY AND MANUFACTURING METHOD THEREOF

CROSS-REFERENCE TO RELATED APPLICATIONS

The present application is a continuation of and claims the benefit of priority to International Application No. PCT/JP2022/017740, filed Apr. 13, 2022, which is based upon and claims the benefit of priority to Japanese Application No. 2021-068397, filed Apr. 14, 2021. The entire contents of these applications are incorporated herein by reference.

BACKGROUND OF THE INVENTION

Field of the Invention

The present invention relates to microlens arrays and manufacturing methods thereof, which is effective when applied to solid-state imaging elements, display devices and the like.

Description of Background Art

In Japanese Unexamined Patent Application Publication No. 2009-109965, there is provided a microlens array in which the planar shapes of the microlenses are set to be rectangular in the imaging pixels and circular in the PDAF pixels, and there is further provided a microlens array in which the film thickness of the ML2s is set to be greater than that of the ML1s. Furthermore, a solid-state imaging device has been proposed in which microlenses having different refractive indexes for imaging pixels and PDAF pixels are formed on the same plane (see, for example, Japanese Unexamined Patent Application Publication No. 2013-21168). The entire contents of these publications are incorporated herein by reference.

SUMMARY OF THE INVENTION

According to one aspect of the present invention, a microlens array includes microlenses including first microlenses and a second microlens and positioned such that the microlenses correspond to types of color filters, respectively. The microlenses are formed such that the second microlens has a height that is greater than a height of the first microlenses and that the second microlens has a lens part and a pedestal part adjoining the lens part.

According to one aspect of the present invention, a method of manufacturing a microlens array includes forming a pedestal part of a second microlens on a microlens formation substrate of a microlens array, and forming a photoresist film on the microlens formation substrate including the pedestal part of the second microlens such that a lens part of the second microlens and first microlenses are formed on the microlens formation substrate simultaneously. The microlens array includes microlenses including the first microlenses and the second microlens and positioned such that the microlenses correspond to types of color filters, respectively, and the microlenses is formed such that the second microlens has a height that is greater than a height of the first microlenses and that the second microlens has the lens part and the pedestal part adjoining the lens part.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
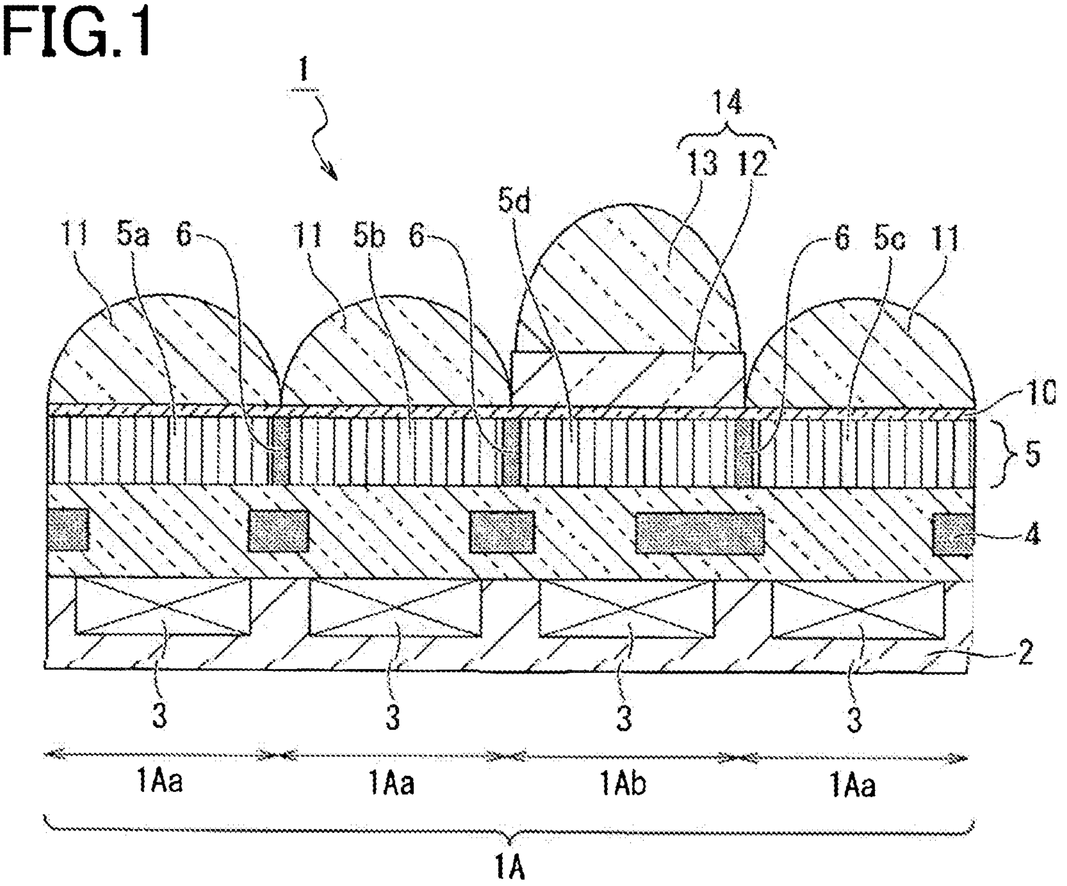
FIG. 1 is a schematic cross-sectional view of a solid-state imaging element including a microlens array according to an embodiment of the present invention.

Embodiments will now be described with reference to the accompanying drawings, wherein like reference numerals designate corresponding or identical elements throughout the various drawings.

Embodiment

An embodiment, in which a microlens array according to an embodiment of the present invention is employed in a solid-state imaging device, will be described hereinafter with reference to FIGS. 1 to 4.

Configuration Example of Solid-State Imaging Element

Figure 2:
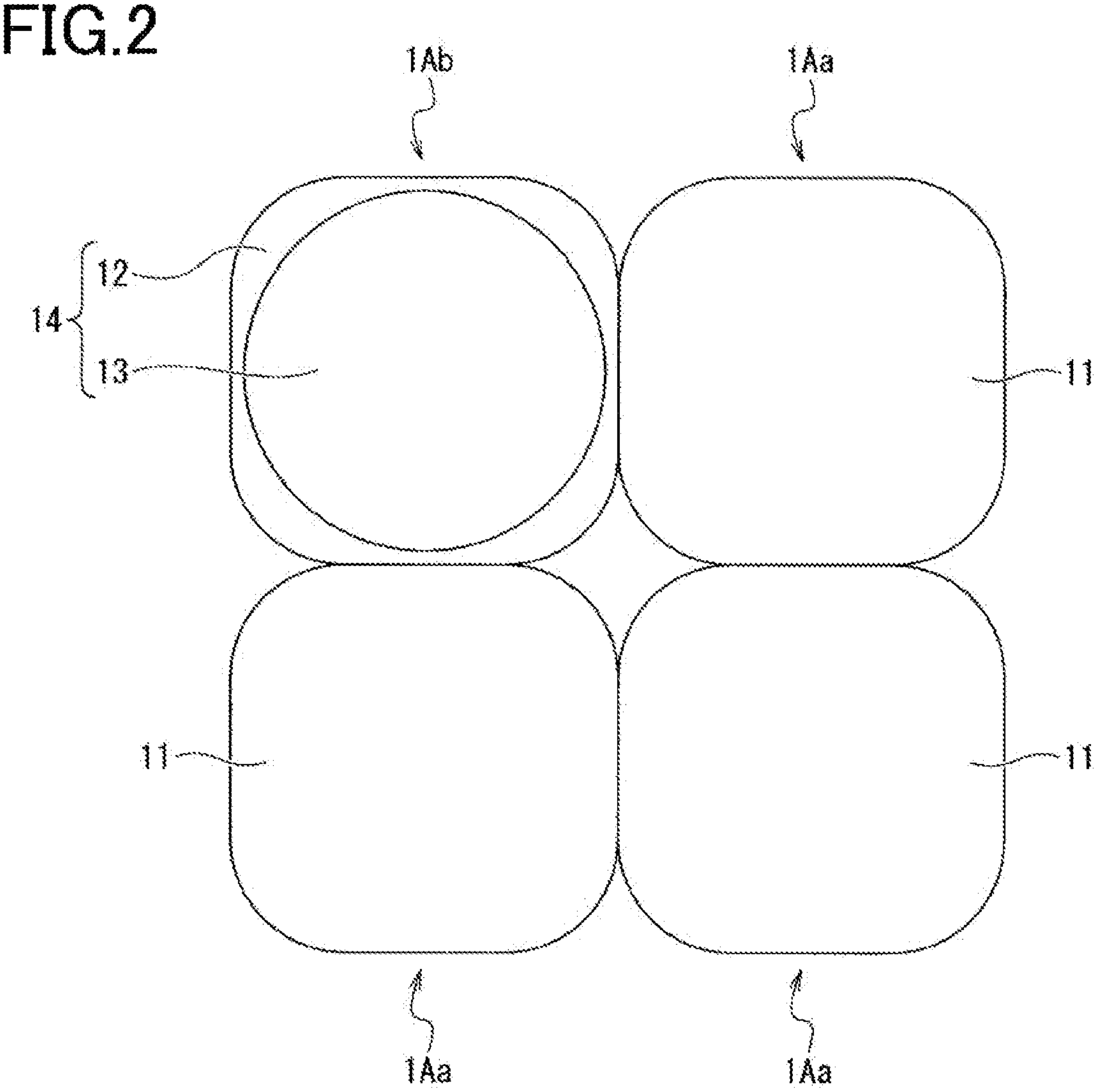
FIG. 2 is a plan view showing a microlens array according to an embodiment of the present invention.

FIG. 1 is a schematic configuration diagram of the solid-state imaging device. FIG. 2 is a plan view showing the arrangement of the microlens array. As shown in FIG. 1, a pixel array unit 1A of the solid-state imaging device 1 includes, as pixels, pixels (imaging pixels) 1Aa that generate signals for generating a captured image based on received subject light and a pixel (PDAF pixel) 1Ab that generates a signal for performing focus detection.

Each of the imaging pixels 1Aa has a photoelectric conversion element 3 formed in a semiconductor substrate 2; the photoelectric conversion element 3 receives incident light and performs photoelectric conversion. On the semiconductor substrate 2, there are formed a wiring layer (not shown), a light-shielding film 4 and a color filter layer 5 in this order; the color filter layer 5 is a filter unit in which are positioned color filters 5*a* to 5*c* having spectral characteristics corresponding to the respective imaging pixels 1Aa. Between the adjacent color filters 5*a* to 5*c* of the color filter layer 5, there are provided respective partition walls 6. The partition walls 6 may be omitted. On the color filter layer 5, there are formed, via a microlens formation layer 10 that is a substrate for forming microlenses, microlenses 11 for the imaging pixels which are first microlenses.

Similar to the imaging pixels 1Aa, the PDAF pixel 1Ab also has a photoelectric conversion element 3 formed in the semiconductor substrate 2; and on the semiconductor substrate 2, there are formed the wiring layer (not shown), a light-shielding film 4, the color filter layer 5 and a microlens 14 for the PDAF pixel which is a second microlens. In addition, in the PDAF pixel 1Ab, there is positioned a color filter 5*d* of the color filter layer 5; the color filter 5*d* is separated from the imaging pixels 1Aa by partition walls 6. These partition walls 6 may also be omitted as those described above. The color filter 5*d* may be red, green, blue, transparent or the like, but green is preferable because the sensitivity of the photodiode is high in this case. In addition, it is preferable for the light-shielding film 4, which blocks part of the light incident on the photoelectric conversion element 3, to be formed so as to have an opening whose size is substantially half the size of a light-receiving region of the photoelectric conversion element 3.

Moreover, in the imaging pixels 1Aa and the PDAF pixel 1Ab, the microlenses 11 and 14 are formed on the microlens formation layer 10, i.e., on the same plane, to constitute the microlens array. Furthermore, in the PDAF pixel 1Ab, the microlens 14 includes a lens part 13 and a pedestal part 12 formed between the lens part 13 and the color filter layer 5, i.e., between the lens part 13 and the microlens formation layer 10. Consequently, the microlens 14 of the PDAF pixel 1Ab has a greater height than the microlenses 11 of the imaging pixels 1Aa.

Moreover, as shown in FIGS. 1 and 2, in the imaging pixels 1Aa, the microlenses 11 are formed uniformly, i.e., formed in the same shape and size to have the same light collection point. On the other hand, in the PDAF pixel 1Ab, the light collection point can be finely set by adjusting the shape and thickness of the lens part 13.

Specifically, in each of the imaging pixels 1Aa, the light collection point is set by the microlens 11 to be on a light-receiving surface of the photoelectric conversion element 3. On the other hand, in the PDAF pixel 1Ab, the light collection point is set to be on an upper surface of the light-shielding film 4. Although only one PDAF pixel 1Ab is employed in FIGS. 1 and 2, it is also possible to employ PDAF pixels 1Ab.

Microlens Array Manufacturing Method

Figure 3:
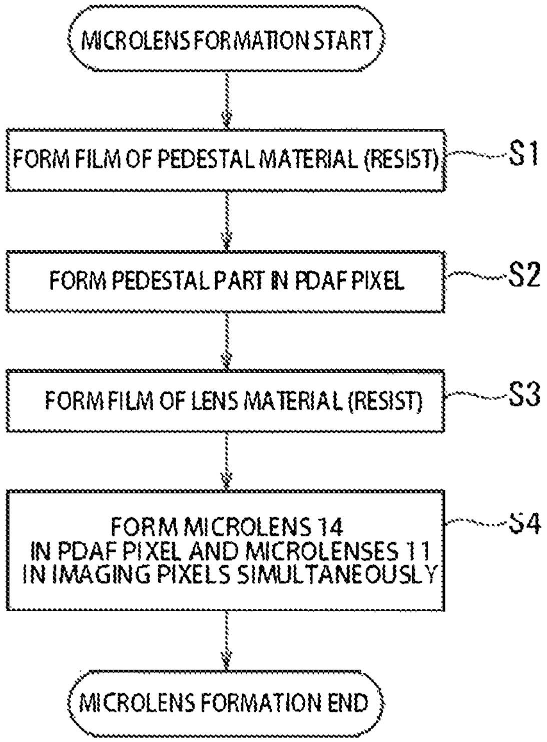
FIG. 3 is a flowchart illustrating a microlens array manufacturing method according to an embodiment 6 of the present invention.

Next, a microlens array manufacturing method according to the present embodiment will be described with reference to FIGS. 3 and 4. FIG. 3 is a flowchart illustrating the procedure of the microlens array manufacturing method. FIG. 4 is a diagram illustrating a formation of the microlens array manufacturing method.

Figure 4A:
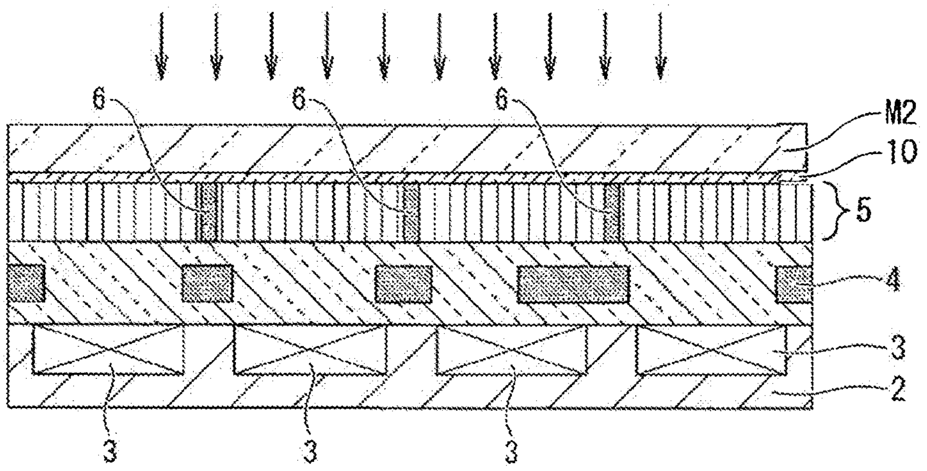
FIGS. 4A-4D are diagrams illustrating a formation a microlens array manufacturing method according to an embodiment 6 of the present invention.

In S1 of FIG. 3, as shown in FIG. 4(A), a photoresist film M2 of a pedestal material is formed on the microlens formation layer 10 that is on the color filter layer 5. The pedestal material has a refractive index equal to that of a lens material.

Figure 4B:
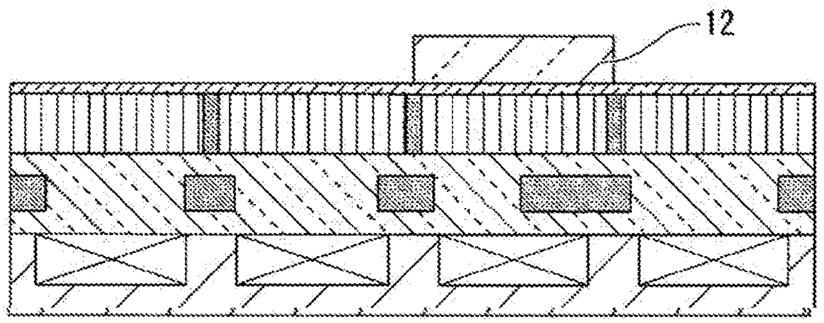

In S2 of FIG. 3, as shown in FIG. 4(B), the pedestal part 12 is formed on the PDAF pixel 1Ab by photolithography.

Figure 4C:
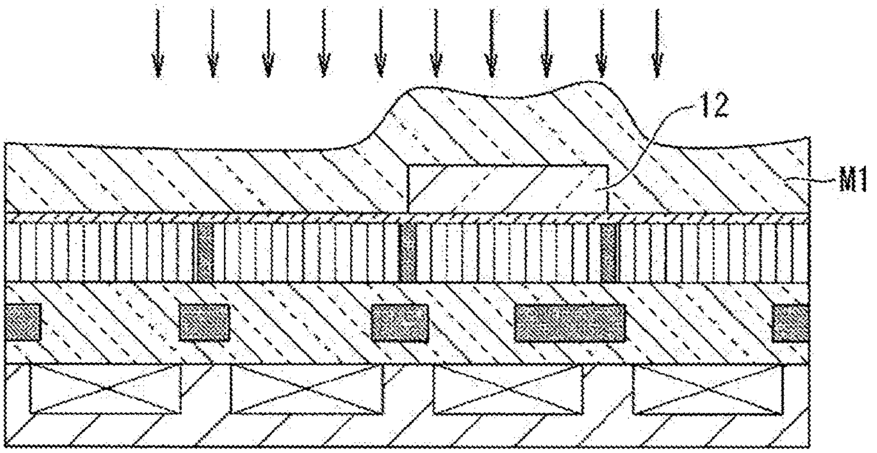

In S3 of FIG. 3, as shown in FIG. 4(C), a photoresist film M1 of the lens material is formed on the microlens formation layer 10 including the pedestal part 12.

Figure 4D:
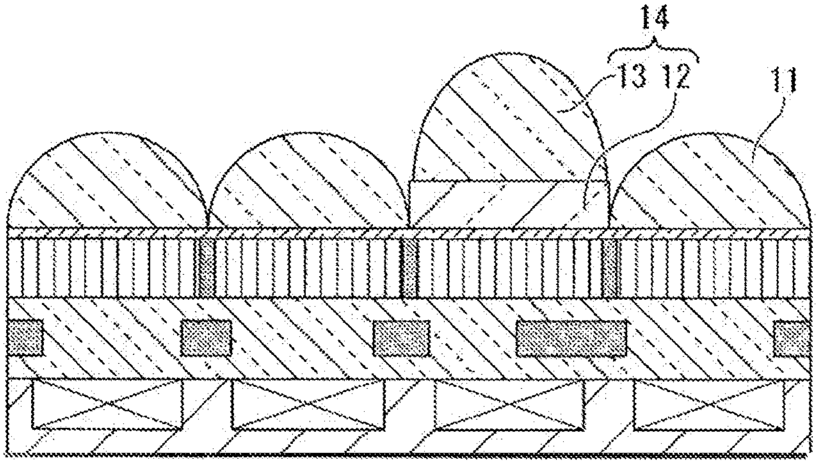

In S4 of FIG. 3, as shown in FIG. 4(D), the microlenses 11 are formed on the microlens formation layer 10; and the lens part 13 is formed on the pedestal part 12 adjacently to the microlenses 11. Consequently, the microlenses 11 of the imaging pixels 1Aa and the microlens 14 of the PDAF pixel 1Ab are formed simultaneously, making up the microlens array.

That is, by forming the pedestal part 12 in the PDAF pixel 1Ab, the lens part 13 is formed to have a height substantially equal to the result of subtracting the height of the pedestal part 12 from the difference between the desired height of the microlens 14 and the desired height of the microlenses 11. Consequently, it becomes possible to form, without increasing the transmittance control range of the gray-tone mask required for forming the lens shapes, a microlens array having two types of microlenses with the transmittance in a controllable region. Hence, as described above, in S4, the microlens array can be obtained by forming the microlenses 11 and the microlens 14 (the lens part 13) on the same microlens formation layer 10 simultaneously.

For example, in the case where the transmittance of the gray-tone mask GMT for forming the apexes of the microlenses 11 is set to 50%, the transmittance of the gray-tone mask GMT for forming the apex of the microlens 14 is set to 35% and the pedestal part 12 having a height of 0.3 μm is formed under the lens part 13 of the microlens 14, the microlens array can be manufactured as described above with the lens material and the pedestal material both of which are commercially available. That is, the microlenses 11 and 14 are formed by the photolithography method in which the photoresist films M1 and M2 are formed on the microlens formation layer 10 and exposed through the gray-tone mask GTM. Moreover, the exposure is carried out with an exposure device that uses an ultraviolet wavelength for the light source. As a result, the microlens array can be easily manufactured which is constituted of the microlenses 11 and 14 that are shaped as shown in FIG. 2, i.e., are visually different from ordinary microlenses and include three types of layers.

In addition, in the case of the difference in microlens height between the imaging pixels 1Aa and the PDAF pixel 1Ab being greater than 0.61 μm, if the photoresist film of the commercially-available lens material is formed by the photolithography method, the microlens transmittance difference between the imaging pixels 1Aa and the PDAF pixel 1Ab is set to be about 25% or more and 30% or less. If this is applied to a material whose transmittance in the controllable region is higher than or equal to an upper limit of 30% and lower than or equal to a lower limit of 80%, it includes the upper limit (T2) or the lower limit (T1) of the controllable transmittance. Therefore, it is difficult to simultaneously form the microlenses with the difference in height therebetween being greater than 0.6 μm. Hence, in the present embodiment, in order to obtain a desired height difference, the pedestal part 12 is formed in advance in the PDAF pixel 1Ab.

Regarding the difference in height between the microlens 14 of the PDAF pixel 1Ab and the microlenses 11 of the imaging pixels 1Aa, the height of the lens part 13 excluding the height of the pedestal part 12 is greater than the height of the microlenses 11 of the imaging pixels 1Aa. The difference in height between the lens part 13 of the PDAF pixel 1Ab and the microlenses 11 of the imaging pixels 1Aa is preferably greater than 0 μm and less than or equal to 0.6 μm, and more preferably greater than or equal to 0.2 μm and less than or equal to 0.4 μm. If this range is exceeded, as described above, it will become difficult to control the transmittance and thus will become difficult to form the microlenses of the imaging pixels 1Aa and the PDAF pixel 1Ab simultaneously.

The height of the pedestal part 12 is preferably greater than or equal to 0.1 μm and less than or equal to 0.5 μm, more preferably greater than or equal to 0.2 μm and less than or equal to 0.4 μm. If the height of the pedestal part 12 is less than 0.1 μm, the effect of forming the pedestal part 12 cannot be sufficiently achieved. On the other hand, if the height of the pedestal part 12 is greater than 0.5 μm, the shape of the pedestal part 12 may become uneven during heat treatment in a baking or the like. Consequently, the mounting surface of the pedestal part 12, on which the lens part 13 is mounted, may become uneven, thereby making it difficult to maintain the shape of the PDAF pixel microlens ML2.

Moreover, if the difference in refractive index between the photoresist film M1 of the lens material and the photoresist film M2 of the pedestal material is less than or equal to 0.1, the influence on the light collection can be reduced. In particular, if the lens material for forming the photoresist film M1 and the pedestal material for forming the photoresist film M2 are the same material (or have the same refractive index), the influence on the light collection can be eliminated.

As described above, according to the present embodiment, in the lithography during the microlens formation, it is possible to prevent the shapes of the microlenses 11 from becoming different between one of the imaging pixels 1Aa which adjoins the PDAF pixel 1Ab and one of the imaging pixels 1Aa which does not adjoin the PDAF pixel 1Ab; it is also possible to prevent the microlenses 11 of the imaging pixels 1Aa and the microlens 14 of the PDAF pixel 1Ab from being formed into undesired shapes. That is, by forming the microlenses 11 of the imaging pixels 1Aa and the microlens 14 of the PDAF pixel 1Ab, which has a different film thickness from the microlenses 11, on the same microlens formation layer 10 simultaneously, it becomes possible to improve the positional accuracy between the microlenses 11 and 14; it also becomes possible to provide the microlens array and the manufacturing method thereof which can form the microlenses 11 and 14 into the desired shapes even if they are formed simultaneously.

Applying the solid-state imaging device 1 according to the present embodiment as described above to an electronic device such as a digital camera, a video camera or a camera-equipped mobile phone, it is possible to secure excellent sensitivity of the imaging pixels while maintaining the PDAF characteristics. As a result, the image quality can be improved.

Other Embodiments

Figure 5:
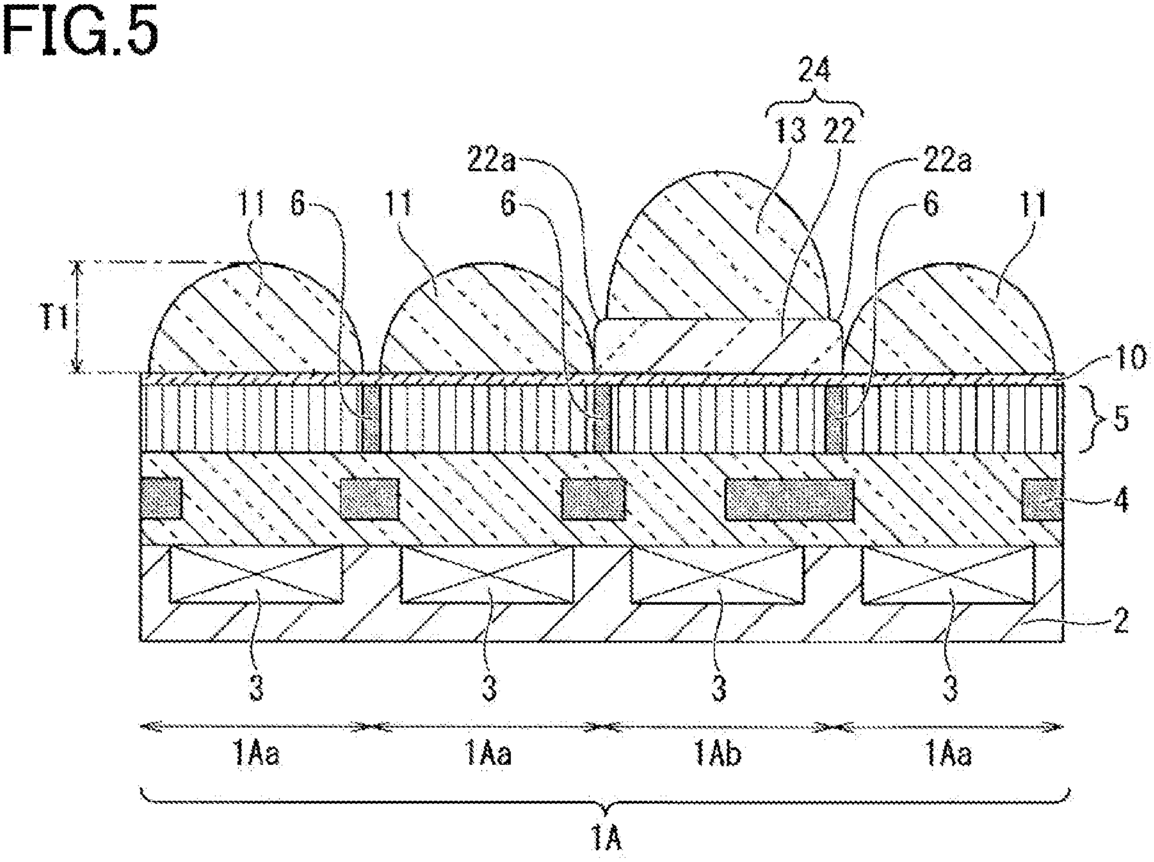
FIG. 5 is a schematic cross-sectional view of a solid-state imaging element including a microlens array according to another embodiment of the present invention.
Figure 6:
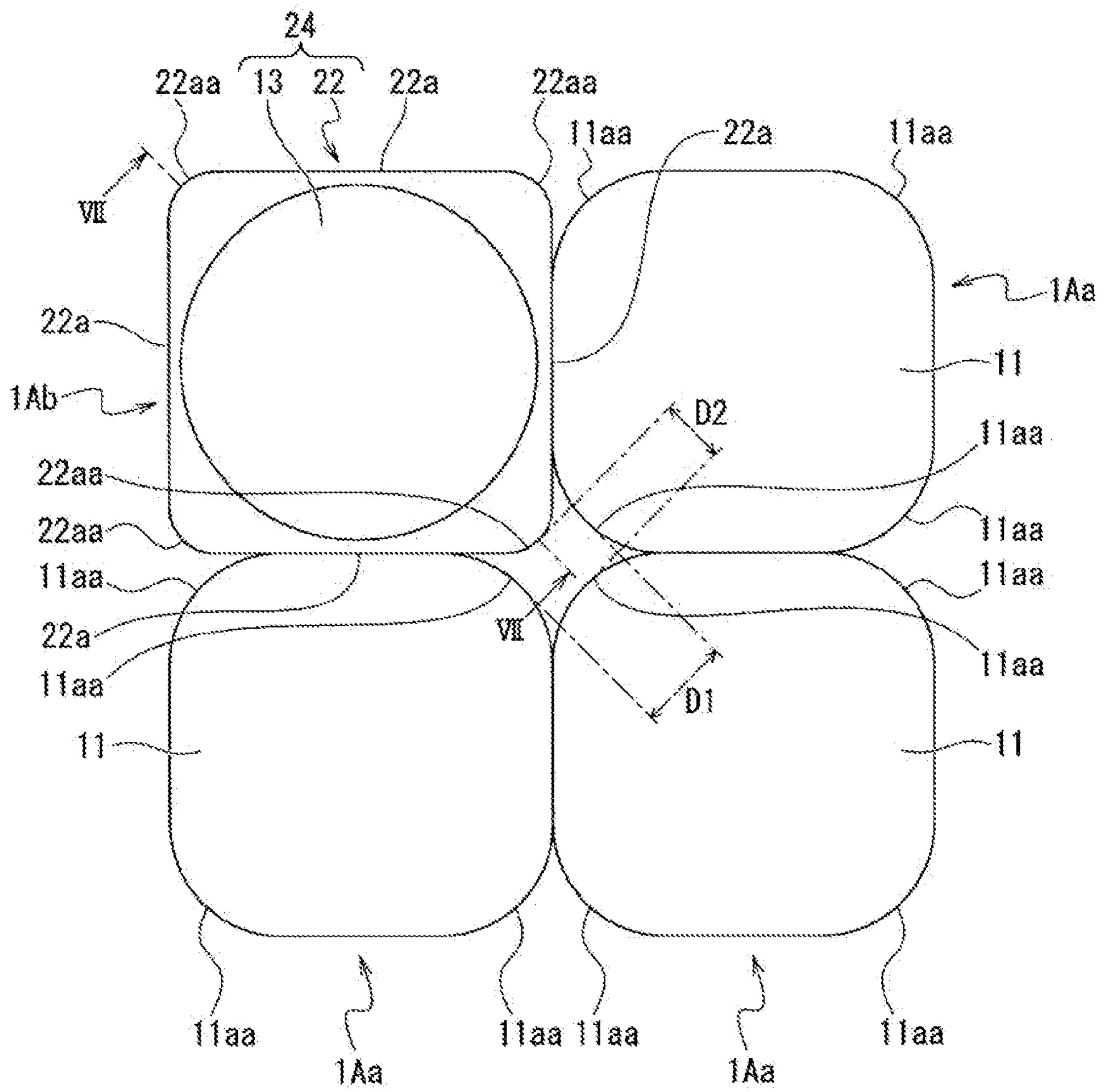
FIG. 6 is a plan view showing a microlens array according to another embodiment of the present invention.
Figure 7:
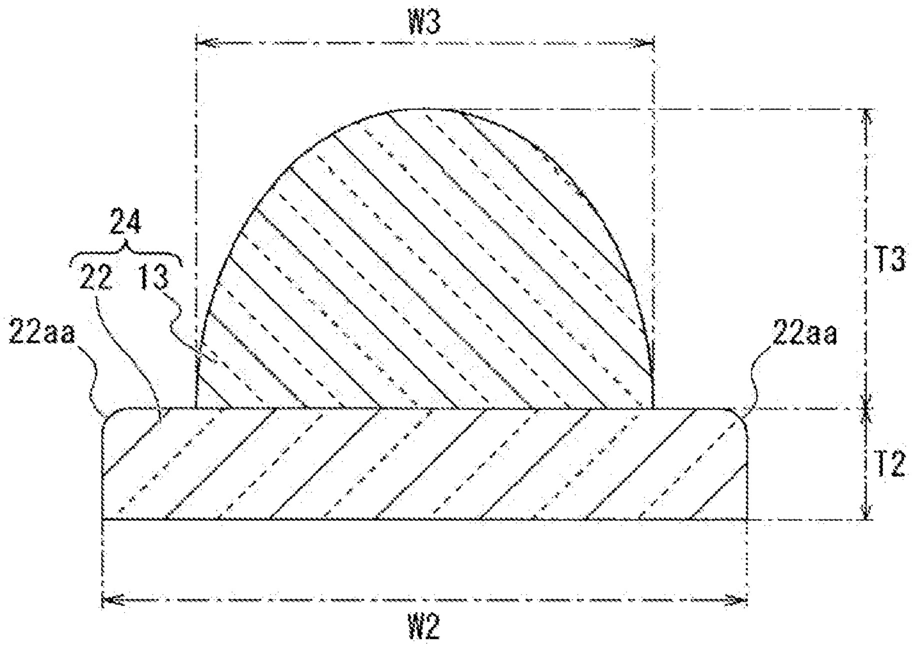
FIG. 7 is a cross-sectional view taken along the line VII-VII of FIG. 6.

For example, as shown in FIGS. 5 to 7, a microlens 24 may be configured to include a pedestal part 22. The pedestal part 22 has a peripheral edge portion 22*a* exposed from the lens part 13 in a width direction, and rounding R is applied to the peripheral edge portion 22*a* to form a curved surface. By applying the rounding R, it becomes possible to collect light which is incident from the peripheral edge portion 22*a* of the pedestal part 22 without entering the lens part 13. Consequently, it becomes possible to enhance the photosensitivity of the PDAF pixel 1Ab.

Moreover, the pedestal part 22 of the microlens 24 of the PDAF pixel 1Ab is positioned on the color filter layer 5 via the microlens formation layer 10 so as to cover the entire region of the PDAF pixel 1Ab surrounded by the partition walls 6. That is, the pedestal part 22 is provided on the color filter layer 5 via the microlens formation layer 10 so as to cover the entire region of the color filter layer 5 of the PDAF pixel 1Ab surrounded by the color filters 5*a* to 5*c* of the imaging pixels 1Aa. Consequently, the light in the region of the PDAF pixel 1Ab can be received without leakage, and thus the photosensitivity of the PDAF pixel 1Ab can be further enhanced. In addition, the pedestal part 22 may cover at least part of the partition walls 6 adjoining the PDAF pixel 1Ab in a plan view. It is preferable for the pedestal part 22 to cover the entire partition walls 6 adjoining the PDAF pixel 1Ab; this is because the above-described effect of enhancing the photosensitivity of the PDAF pixel 1Ab can be further improved in this case.

Furthermore, as shown in FIG. 6, the shortest distance D2 between the pedestal part 22 of the microlens 24 of the PDAF pixel 1Ab and the microlens 11 of the imaging pixel 1Aa located at a diagonally adjacent position to the pedestal part 22 is less than the shortest distance D1 between the imaging pixels 1Aa located at diagonally adjacent positions to each other (D2<D1). In other words, the radius of curvature R22*aa* of four corner portions 22*aa* of the pedestal part 22 is less than the radius of curvature R11*aa* of four corner portions 11*aa* of each of the microlenses 11 (R22*aa*<R11*aa*). Consequently, the amount of light received in the region of the PDAF pixel 1Ab can be increased, and thus the photosensitivity of the PDAF pixel 1Ab can be further enhanced.

It is preferable that the ratio of the area of the pedestal part 22 to the area of the lens part 13 in a plan view as shown in FIG. 6 is greater than or equal to 1.27 and less than or equal 1.33. Setting the pedestal part 22 to satisfy the above ratio, it is possible to effectively achieve the above-described effect.

Moreover, as shown in FIG. 7, the maximum width W2 of the pedestal part 22 of the microlens 24 of the PDAF pixel 1Ab is greater than the maximum width W3 of the lens part 13 (W2>W3). In other words, the pedestal part 22 is exposed from the lens part 13 in the width direction. Consequently, light incident on the pedestal part 22 without entering the lens part 13 can also be collected, and thus the photosensitivity of the PDAF pixel 1Ab can be further enhanced.

Furthermore, it is preferable to set the pedestal part 22 so that the ratio of the maximum width W2 of the pedestal part 22 to the maximum width W3 of the lens part 13 in the cross-sectional shape of the microlens 24 as shown in FIG. 7 is greater than or equal to 1.2 and less than or equal to 1.4 (1.2≤(W2/W3)≤1.4). This is because the above-described effect can be effectively achieved in this case.

Moreover, it is preferable to set the pedestal part 22 so that the ratio of the height T2 of the pedestal part 22 to the height T3 of the lens part 13 of the microlens 24 is greater than or equal to 0.1 and less than or equal to 0.5 (0.1≤(T2/T3)≤0.5). If the ratio is less than 0.1, the effect achievable by the provision of the pedestal part 22 will be too small. On the other hand, if the ratio is greater than 0.5, the lens part 13 will become relatively too small, which may cause a decrease in the light collection efficiency. The same also applies to the lens part 13 and the pedestal part 12 of the microlens 14 in the main embodiment described above.

In particular, as in the case of the pedestal part 12 in the main embodiment described above, the height T2 of the pedestal part 22 is preferably greater than or equal to 0.1 μm and less than or equal to 0.5 μm, more preferably greater than or equal to 0.2 μm and less than or equal to 0.4 μm. In contrast, the height T3 of the lens part 13 is preferably greater than or equal to 0.9 μm and less than or equal to 1.5 μm, more preferably greater than or equal to 1.0 μm and less than or equal to 1.4 μm, even more preferably greater than or equal to 1.1 μm and less than or equal to 1.3 μm. On the other hand, the height T1 of the microlenses 11 is preferably greater than or equal to 0.6 μm and less than or equal to 1.2 μm, more preferably greater than or equal to 0.7 μm and less than or equal to 1.1 μm, even more preferably greater than or equal to 0.8 μm and less than or equal to 1.0 μm. This is because the above-described effect can be most efficiently exhibited in the embodiments including the main embodiment described above.

Moreover, in the above-described embodiment, the difference in refractive index between the photoresist film M1 of the lens material and the photoresist film M2 of the pedestal material is described as being less than or equal to 0.1; more particularly, the refractive index of the photoresist film M1 of the lens material and the refractive index of the photoresist film M2 of the pedestal material are described as being equal to each other. However, if the refractive index of the photoresist film M2 of the pedestal material is higher than the refractive index of the photoresist film M1 of the lens material, it will be possible to suppress total internal reflection from occurring at the interface between the lens part 13 and the base part 22. Therefore, it can be applied even when the difference in refractive index between the photoresist film M1 of the lens material and the photoresist film M2 of the pedestal material is greater than 0.1.

Figure 8:
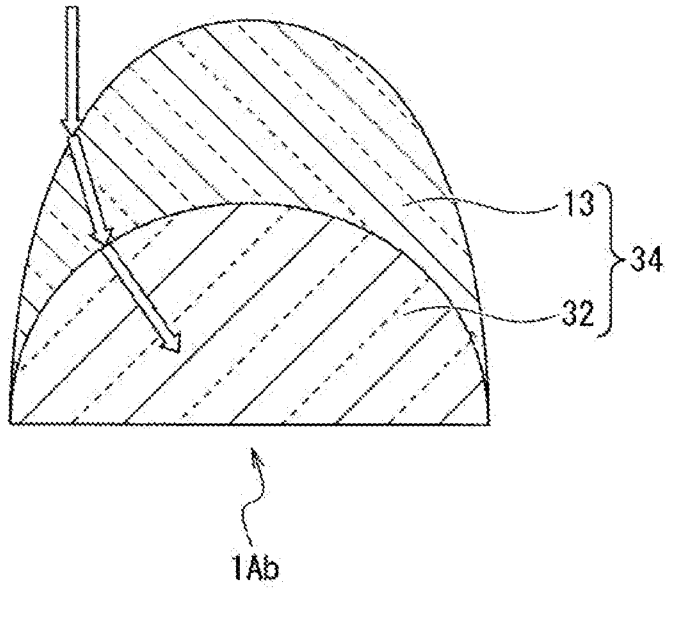
FIG. 8 is a schematic cross-sectional view of a part of a microlens array according to yet another embodiment of the present invention.

Furthermore, as shown in FIG. 8, a pedestal part 32 may have its light incident surface curved into a dome shape such that the height increases toward the center, i.e., the pedestal part 32 may have a convex lens shape. That is, the PDAF pixel 1Ab may include a microlens 34 in which the lens part 13 is provided on the convex-lens-shaped pedestal part 32.

In this way, the microlens 34 is manufactured by forming the photoresist films M1 and M2 by selecting commercially-available lens material and pedestal material so that the difference of the optical refractive index of the pedestal part 32 from the optical refractive index of the lens part 13 is greater than 0.1. Consequently, the light incident on the pedestal part 32 from the lens part 13 can be further greatly refracted toward the center and thus the focal position can be shortened; hence, the height of the microlens 34 can be reduced, thereby achieving a reduction in the size thereof.

Figure 9:
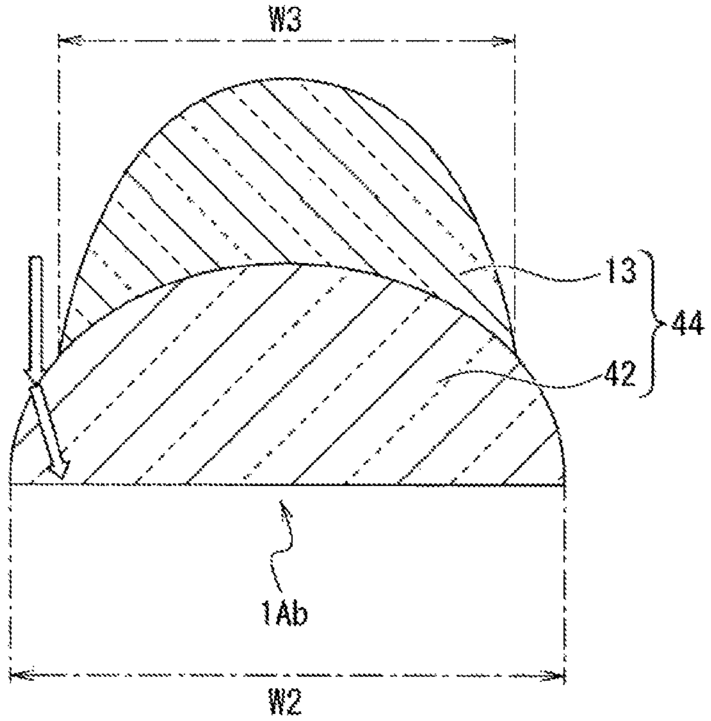
FIG. 9 is a schematic cross-sectional view of a part of a microlens array according to still another embodiment of the present invention.

Furthermore, as shown in FIG. 9, the PDAF pixel 1Ab may include, for example, a microlens 44 in which the maximum width W2 of a convex-lens-shaped pedestal part 42 is greater than the maximum width W3 of the lens part 13 (W2>W3), as in the other embodiments described above. Consequently, the microlens 44 has a curved surface formed at the pedestal part 42 exposed from the lens part 13 in the width direction. Hence, light incident on the pedestal part 42 without entering the lens part 13 can be collected more toward the center, and thus the photosensitivity of the PDAF pixel 1Ab can be further enhanced.

In such a microlens 44 of the PDAF pixel 1Ab, the technical features of the above-described embodiments can be suitably applied in combination as appropriate, and thus it is possible to achieve the same effects as achievable in the above-described embodiments.

Display Device

In the above-described embodiments, explanation is given of the microlens array applied to the solid-state imaging device 1. However, an embodiment of the present invention can also be applied to, for example, a display device such as an OLED (Organic Light Emitting Diode) that includes: a substrate; light-emitting diodes provided on the substrate; a filter unit having types of color filters positioned corresponding to the light-emitting diodes; and a microlens array positioned corresponding to the color filters.

As described above, the microlens array according to an embodiment of the present invention can be applied to any microlens arrays that include microlenses having different heights, such as those employed in solid-state imaging devices and display devices and those in which the focal points of the microlenses are set to be different corresponding to the respective color filters. Consequently, by applying the microlens array according to an embodiment of the present invention in the same manner as in the above-described embodiments, it is possible to achieve the same effects as achievable in the above-described embodiments. That is, according to an embodiment of the present invention, it is possible to provide: a microlens array that includes microlenses having different heights without positional deviation between the lenses and has desired lens shapes even if the microlenses are formed simultaneously; a solid-state imaging device employing such a microlens array; a display device employing such a microlens array; and a method of manufacturing such a microlens array.

Conventionally, CCD-type solid-state imaging devices and CMOS-type solid-state imaging devices have been known as solid-state imaging devices employed in digital still cameras and digital video cameras. In these solid-state imaging devices, in general, microlenses are provided for each pixel so as to allow incident light to enter a light receiving unit efficiently.

Moreover, in recent years, solid-state imaging devices perform focus detection by a so-called Phase Detection Auto Focus (PDAF) method, i.e., a method in which phase difference detection pixels are provided along with imaging pixels in a pixel array unit, and the focus is detected based on the amount of shift between signals outputted by a pair of phase difference detection pixels. The PDAF is a high-speed automatic autofocus technique. In a pair of PDAF pixels, mutually different halves of light-receiving surfaces thereof are shielded from light by a light-shielding film; and image signals are generated which are signals of images captured by the respective pixels. The focal position can be detected by detecting the phase difference between the images based on the generated image signals.

In the solid-state imaging devices as described above, the imaging pixels and the PDAF pixels are formed on the same support substrate. The sensitivity of each of the imaging pixels becomes highest when the light collection point of the microlens is on a light-receiving surface of a photoelectric conversion unit that is located at a lower layer than the light-shielding film. On the other hand, the autofocus (AF) performance of each of the PDAF pixels becomes highest when the light collection point of the microlens is in the vicinity of the light-shielding film. Therefore, the light collection points of the microlenses (to be referred to as "ML1s" hereinafter) positioned in the imaging pixels and the microlenses (to be referred to as "ML2s" hereinafter) positioned in the PDAF pixels are varied by varying the curvatures thereof.

In Japanese Unexamined Patent Application Publication No. 2009-109965, in order to optimize the sensitivity of each of the imaging pixels and the AF performance of each of the PDAF pixels, there is provided a microlens array in which the planar shapes of the microlenses are set to be rectangular in the imaging pixels and circular in the PDAF pixels, thereby making the curvatures of the microlenses in the imaging pixels different from those of the microlenses in the PDAF pixels.

Moreover, in Japanese Unexamined Patent Application Publication No. 2009-109965, there is further provided a microlens array in which the film thickness of the ML2s is set to be greater than that of the ML1s, thereby making the curvatures of lens surfaces of the ML2s greater than those of lens surfaces of the ML1s.

Furthermore, a solid-state imaging device has been proposed in which microlenses having different refractive indexes for imaging pixels and PDAF pixels are formed on the same plane (see, for example, Japanese Unexamined Patent Application Publication No. 2013-21168).

In solid-state imaging devices such as those described in Japanese Unexamined Patent Application Publication No. 2009-109965 and Japanese Unexamined Patent Application Publication No. 2013-21168, in the case of forming ML2s, whose curvature and refractive index are different from those of ML1s, on the same plane as the ML1s, it is necessary to form the microlens array in two processes. In each process, a three-dimensional microlens pattern is produced by exposing and developing a resist using a gray-tone mask whose light transmittance changes stepwise. Consequently, a microlens array can be obtained in which microlenses having different film thicknesses and/or shapes are formed.

Figure 10A:
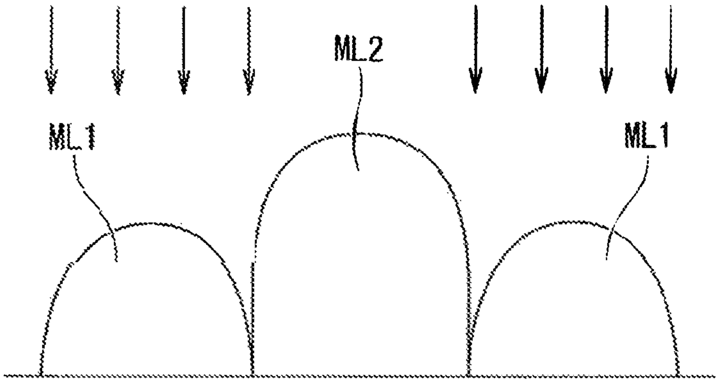
FIGS. 10A and 10B are cross-sectional views illustrating the positional relationship between a PDAF pixel microlens and imaging pixel microlenses.
Figure 10B:
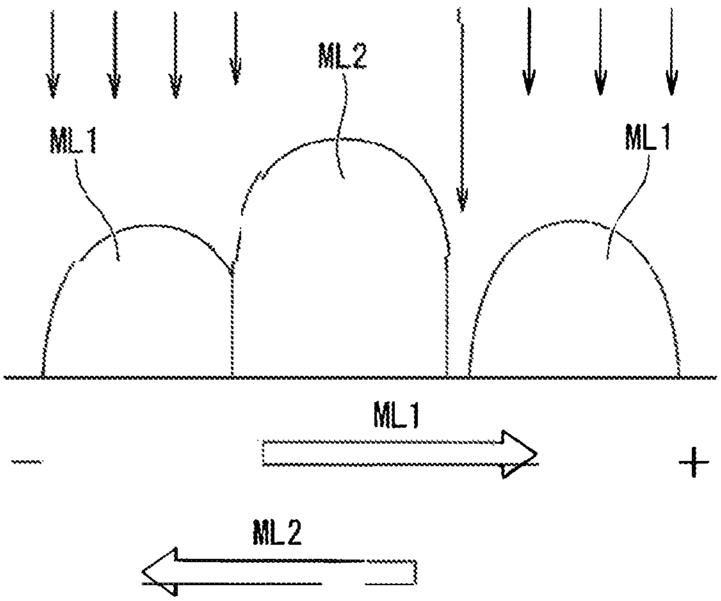

However, in the lithography during the microlens formation, due to the positional deviation of the patterns between the processes, the shapes of the microlenses may become different between the imaging pixels adjoining the PDAF pixels and the imaging pixels not adjoining the PDAF pixels, resulting in a difference in sensitivity between them. In FIGS. 10A and 10B, there are shown diagrams illustrating the deterioration of the shapes of the ML1s due to the positional deviation of the patterns between the processes.

Regarding the positional accuracy, when the ML1s and the ML2s are accurately formed without deviation, all the light can be collected as shown in FIG. 10A. However, when one ML1 deviates to the positive side and one ML2 deviates to the negative side, it becomes as shown in FIG. 10B. The ML2 overlaps the ML1 on the negative side, lowering the light collection efficiency. On the other hand, a gap is formed between the ML2 and the ML1 on the positive side, allowing light to travel straight without being collected; thus, the light collection efficiency is also lowered. Consequently, in the resultant microlens array, the shapes of the microlenses are different between the ML1 of the imaging pixel adjoining the ML2 of the PDAF pixel and the ML1 of the imaging pixel not adjoining the ML2 of the PDAF pixel.

Therefore, it is conceivable to obtain a microlens array by forming the ML1s and the ML2s simultaneously. This is because simultaneous formation makes it possible to improve the positional accuracy between the ML1s and the ML2s and prevent deterioration of the lens shapes. However, in the case of simultaneous formation, microlenses of different film thicknesses are formed simultaneously; therefore, due to manufacturing limitations, it is difficult to create a film thickness difference between the ML1s and the ML2s by transmittance control using a gray-tone mask. The reason will be explained below.

Figure 11A:
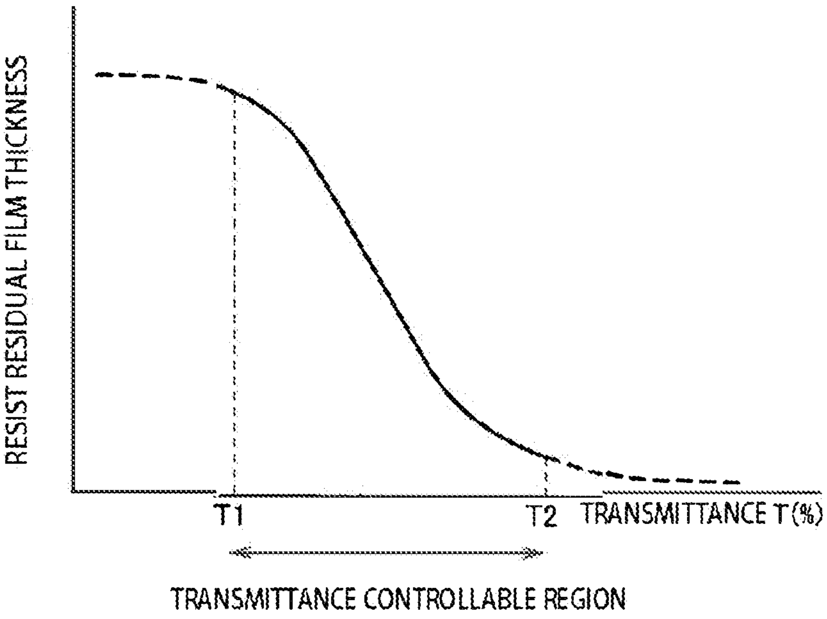
FIG. 11A is a diagram illustrating the relationship between the light transmittance and the resist residual film thickness.
Figure 11B:
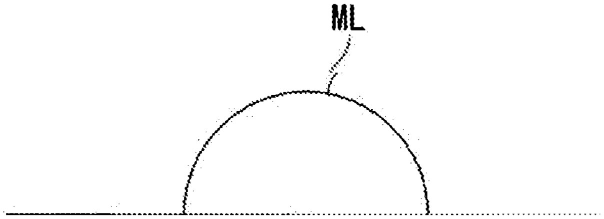
FIG. 11B is a diagram showing the profile of a microlens shape.
Figure 11C:
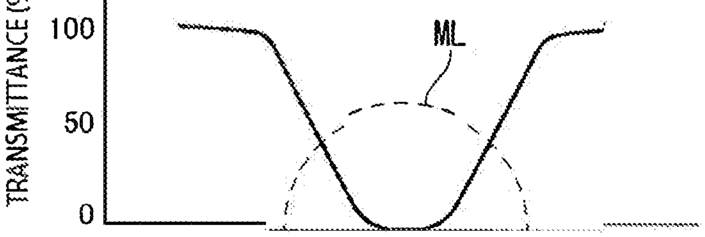
FIG. 11C is a graph illustrating a transmittance distribution function for obtaining the profile required for the microlens.

As an exposure mask, a gray-tone mask is used which has a two-dimensional light transmittance distribution such that the light transmittance changes stepwise corresponding to the lens shapes. FIG. 11A illustrates a transmittance distribution function representing the relationship between the transmittance (the horizontal axis) and the resist residual film thickness (the vertical axis). FIG. 11B shows the profile of a desired cross-sectional shape of a microlens ML. FIG. 11C illustrates a transmittance distribution function for obtaining the required thickness of the microlens ML calculated based on a cross-sectional view of the microlens ML and FIGS. 11A and 11B. In FIG. 11C, the vertical axis represents the light transmittance (%); and the horizontal axis represents the cross-sectional position.

The dashed-line portions of the transmittance distribution function in FIG. 11A represent transmittance regions where the reproducibility of the relationship between the transmittance and the resist residual film thickness is low. When regions of the transmittance distribution function are selectable, it is preferable to select a region obtained from the solid-line portion excluding the dashed-line portions. The low reproducibility of the relationship between the transmittance and the resist residual film thickness means that in the regions near the upper limit T2 and the lower limit T1, a film thickness difference can be easily created between the in-plane microlenses and the microlenses may be formed into undesired heights and shapes. Moreover, control of development conditions is very difficult. If the development is carried out excessively, the film thickness will become excessively small. In contrast, if the development is carried out insufficiently, the film thickness will become excessively large. That is, control of conditions of the photolithography is very difficult and a decrease in yield may be caused. Therefore, in the regions near the upper limit T2 and the lower limit T1, the controllability of the lens shapes is low and thus it may be impossible to form the microlenses into the desired shapes.

Figure 12A:
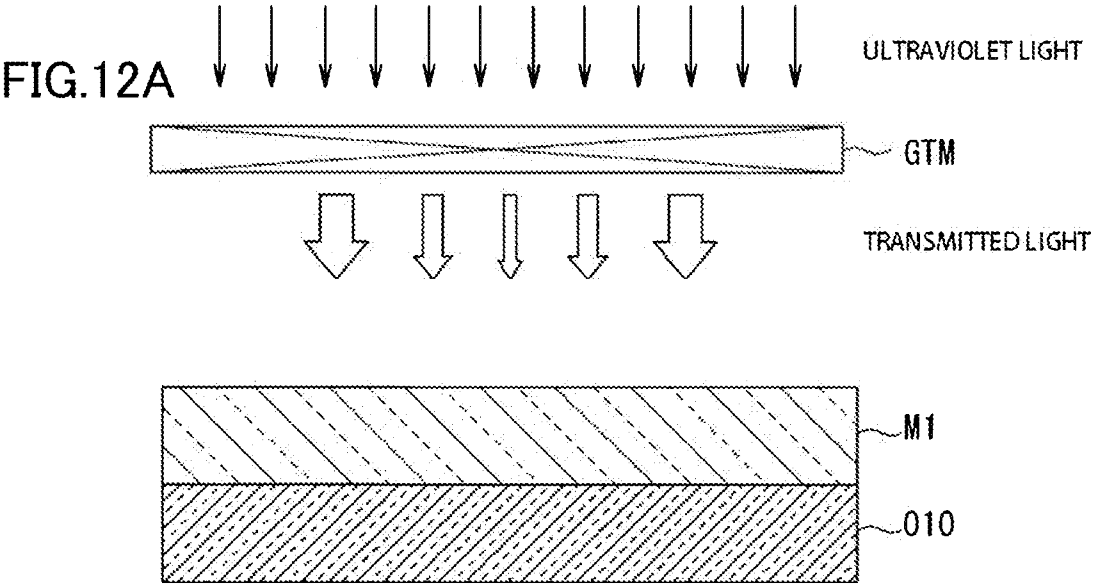
FIGS. 12A and 12B are diagrams illustrating a formation of a microlens manufacturing method using a gray-tone mask.
Figure 12B:
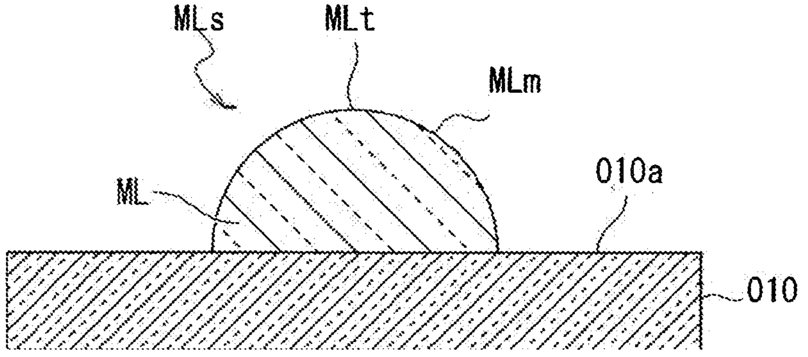

As shown in FIG. 12A, in order to form a desired surface shape for a photoresist film M1 formed on a microlens formation substrate 010, an exposure process is performed on the photoresist film M1 through a gray-tone mask GTM; then, the photoresist film M1 is subjected to a developing treatment. Consequently, as shown in FIG. 12B, a microlens ML is formed which has a dome shape such that the film thickness of the microlens ML increases continuously as the distance from the surface 010*a* of the substrate 010 increases. That is, the photoresist film M1 has a cross-sectional shape MLs that can be divided into regions of: an apex portion MLt of the microlens ML where the photoresist film M1 is shielded from light and thus remains; the surface 010*a* of the substrate 010 where there is no photoresist film M1 at all; and intermediate portions MLm of the microlens ML where the photoresist film M1 could not be completely shielded from the light and thus remains.

Figure 13:
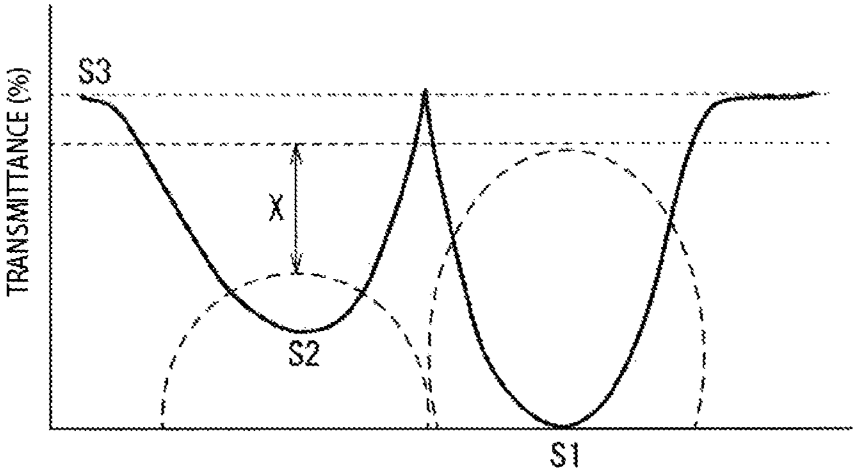
FIG. 13 is a graph illustrating a transmittance distribution function for obtaining the profile of a microlens shape by a conventional method.

In the exposure through the gray-tone mask GTM, to form two types of microlenses ML1 and ML2 having different film thicknesses on the same plane by the conventional method, the gray-tone mask GTM has a transmittance distribution function as shown in FIG. 13. In FIG. 13, X represents the film thickness difference between the two types of microlenses ML1 and ML2; S3 represents the transmittance for completely removing the photoresist film M1; S2 represents the transmittance for forming the apexes of the ML1s; and S1 represents the transmittance for forming the apexes of the ML2s.

The larger the value of X, the wider the range in which the transmittance is controlled becomes. Thus, it becomes difficult to set a transmittance region satisfying the film thickness difference between the two types of microlenses ML1 and ML2 so as not to include the regions near the upper limit T2 and the lower limit T1 in FIG. 11A. In the case of the transmittance region including the upper limit T1, the film thickness shape of the ML2s may become unstable. On the other hand, in the case of the transmittance region including the lower limit T2, the film thickness shape of the ML1s may become unstable.

Such a problem is not limited to the microlens arrays of the solid-state imaging devices described above but may occur in the same manner as described above in any microlens arrays that include microlenses having different heights, such as microlens arrays of display devices that employ light-emitting diodes.

Therefore, a microlens array according to an embodiment of the present invention includes microlenses having different heights without positional deviation between the lenses and has desired lens shapes even if the microlenses are formed simultaneously; a solid-state imaging device employing such a microlens array; a display device employing such a microlens array; and a method of manufacturing such a microlens array.

A microlens array according to an embodiment of the present invention includes microlenses positioned corresponding to types of color filters. The microlens array includes first microlenses and a second microlens having a greater height than the first microlenses. The second microlens includes a lens part and a pedestal part adjoining the lens part.

Moreover, in the microlens array according to an embodiment of the present invention, it is preferable that a maximum width of the pedestal part is greater than a maximum width of the lens part.

Furthermore, in the microlens array according to an embodiment of the present invention, it is preferable that a curved surface is formed at the pedestal part exposed from the lens part in a width direction.

Furthermore, in the microlens array according to an embodiment of the present invention, it is preferable that a shortest distance between the pedestal part and the first microlens located diagonally adjacent to the pedestal part is less than a shortest distance between the first microlenses located diagonally adjacent to each other.

Furthermore, in the microlens array according to an embodiment of the present invention, it is preferable that: a height of the lens part is greater than a height of the first microlenses; and a difference in height between the lens part and the first microlenses is less than or equal to 0.6 μm.

Furthermore, in the microlens array according to an embodiment of the present invention, it is preferable that a height of the pedestal part is greater than or equal to 0.1 μm and less than or equal to 0.5 μm.

A solid-state imaging element according to an embodiment of the present invention includes: a semiconductor substrate having photoelectric conversion elements; a filter unit formed on the semiconductor substrate and having types of color filters positioned corresponding to the photoelectric conversion elements; and the above-described microlens array according to an embodiment of the present invention which is positioned corresponding to the color filters of the filter unit. The first microlenses are imaging pixel microlenses positioned in imaging pixels of a pixel array unit. The second microlens is a PDAF pixel microlens positioned in a PDAF pixel of the pixel array unit.

Moreover, in the solid-state imaging element according to an embodiment of the present invention, it is preferable that the pedestal part covers a region of the filter unit of the PDAF pixel surrounded by the color filters of the imaging pixels.

A display device according to an embodiment of the present invention includes: a substrate; light-emitting diodes provided on the substrate; a filter unit having types of color filters positioned corresponding to the light-emitting diodes; and the above-described microlens array according to an embodiment of the present invention which is positioned corresponding to the color filters.

A microlens array manufacturing method according to an embodiment of the present invention, which is a method of manufacturing the above-described microlens array according to an embodiment of the present invention, includes: forming the pedestal part on a microlens formation substrate; and forming a photoresist film on the microlens formation substrate including the pedestal part and thereby forming the lens part and the first microlenses simultaneously.

According to an embodiment of the present invention, positional deviation between the first microlenses and the second microlens having a different height from the first microlenses can be eliminated; and desired lens shapes can be obtained even if the microlenses are formed simultaneously.

Obviously, numerous modifications and variations of the present invention are possible in light of the above teachings. It is therefore to be understood that within the scope of the appended claims, the invention may be practiced otherwise than as specifically described herein.

The invention claimed is:

1. A microlens array, comprising:

a plurality of microlenses comprising a plurality of first microlenses and a second microlens and positioned such that the plurality of microlenses corresponds to a plurality of types of color filters, respectively, in a thickness direction, wherein the plurality of microlenses is formed such that the second microlens has a height that is greater than a height of the first microlenses and that the second microlens has a lens part and a pedestal part adjoining a surface of the lens part directed toward the plurality of color filters in the thickness direction, and the first microlenses and the pedestal part are directly disposed on a same, planar formation surface.

2. The microlens array as set forth in claim 1, wherein the plurality of microlenses is formed such that a height of the lens part is greater than the height of the first microlenses, and a difference in height between the lens part and the first microlenses is 0.6 μm or less.

3. The microlens array as set forth in claim 1, wherein the plurality of microlenses is formed such that a height of the pedestal part is in a range of 0.1 μm to 0.5 μm.

4. The microlens array as set forth in claim 1, wherein the lens part and the pedestal part are formed of materials having different optical refractive indices.

5. The microlens array as set forth in claim 1, wherein the lens part and the pedestal part are formed of materials having a sane optical refractive index.

6. The microlens array as set forth in claim 1, wherein the plurality of microlenses is formed such that a maximum width of the pedestal part is greater than a maximum width of the lens part.

7. The microlens array as set forth in claim 6, wherein the plurality of microlenses is formed such that a curved surface is formed at the pedestal part exposed from the lens part in a width direction.

8. The microlens array as set forth in claim 6, wherein the plurality of microlenses is formed such that a height of the lens part is greater than the height of the first microlenses, and a difference in height between the lens part and the first microlenses is 0.6 μm or less.

9. The microlens array as set forth in claim 6, wherein the plurality of microlenses is formed such that a shortest distance between the pedestal part and the first microlens positioned diagonally adjacent to the pedestal part is less than a shortest distance between the first microlenses positioned diagonally adjacent to each other.

10. The microlens array as set forth in claim 9, wherein the plurality of microlenses is formed such that a height of the lens part is greater than the height of the first microlenses, and a difference in height between the lens part and the first microlenses is 0.6 μm or less.

11. The microlens array as set forth in claim 7, wherein the plurality of microlenses is formed such that a shortest distance between the pedestal part and the first microlens positioned diagonally adjacent to the pedestal part is less than a shortest distance between the first microlenses positioned diagonally adjacent to each other.

12. The microlens array as set forth in claim 7, wherein the plurality of microlenses is formed such that a height of the lens part is greater than the height of the first microlenses, and a difference in height between the lens part and the first microlenses is 0.6 μm or less.

13. A microlens array, comprising:

a plurality of microlenses comprising a plurality of first microlenses and a second microlens and positioned such that the plurality of microlenses corresponds to a plurality of types of color filters, respectively, wherein the plurality of microlenses is formed such that the second microlens has a height that is greater than a height of the first microlenses and that the second microlens has a lens part and a pedestal part adjoining the lens part, and the plurality of microlenses is formed such that a shortest distance between the pedestal part and the first microlens positioned diagonally adjacent to the pedestal part is less than a shortest distance between the first microlenses positioned diagonally adjacent to each other.

14. The microlens array as set forth in claim 13, wherein the plurality of microlenses is formed such that a height of the lens part is greater than the height of the first microlenses, and a difference in height between the lens part and the first microlenses is 0.6 μm or less.

15. The microlens array as set forth in claim 13, wherein the plurality of microlenses is formed such that a height of the pedestal part is in a range of 0.1 μm to 0.5 μm.

16. A solid-state imaging element, comprising:

a semiconductor substrate having a plurality of photoelectric conversion elements;

a filter unit formed on the semiconductor substrate and comprising a plurality of types of color filters positioned such that the plurality of types of color filters corresponds to the plurality of photoelectric conversion elements, respectively; and the microlens array of claim 1 positioned such that the microlens array corresponds to the color filters of the filter unit, wherein the plurality of microlenses is formed such that the plurality of first microlenses is a plurality of imaging pixel microlenses positioned in a plurality of imaging pixels of a pixel array unit and that the second microlens is a PDAF pixel microlens positioned in a PDAF pixel of the pixel array unit.

17. The solid-state imaging element as set forth in claim 16, wherein the pedestal part covers a region of the filter unit of the PDAF pixel surrounded by the color filters of the imaging pixels.

18. A display device, comprising:

a substrate;

a plurality of light-emitting diodes positioned on the substrate;

a filter unit comprising a plurality of types of color filters positioned such that the plurality of types of color filters corresponds to the light-emitting diodes; and the microlens array of claim 1 positioned such that the microlens array corresponds to the color filters.

19. A method of manufacturing a microlens array, comprising:

forming a pedestal part of a second microlens on a microlens formation substrate of a microlens array; and forming a photoresist film on the microlens formation substrate including the pedestal part of the second microlens such that a lens part of the second microlens and a plurality of first microlenses are formed on the microlens formation substrate simultaneously, wherein the microlens array includes a plurality of microlenses comprising the plurality of first microlenses and the second microlens and positioned such that the plurality of microlenses corresponds to a plurality of types of color filters, respectively, and the plurality of microlenses is formed such that the second microlens has a height that is greater than a height of the first microlenses and that the second microlens has the lens part and the pedestal part adjoining the lens part.

20. The method as set forth in claim 19, wherein the plurality of microlenses is formed such that a shortest distance between the pedestal part and the first microlens positioned diagonally adjacent to the pedestal part is less than a shortest distance between the first microlenses positioned diagonally adjacent to each other.

* * * * *